US012684715B2

(12) United States Patent
Qian

(10) Patent No.: US 12,684,715 B2
(45) Date of Patent: Jul. 14, 2026

(54) DISPLAY DEVICE

(71) Applicants:Wuhan Tianma Microelectronics Co., Ltd., Wuhan (CN); Wuhan Tianma Microelectronics Co., Ltd. Shanghai Branch, Shanghai (CN)

(72) Inventor: Xingchen Qian, Wuhan (CN)

(73) Assignees: Wuhan Tianma Microelectronics Co., Ltd., Wuhan (CN); Wuhan Tianma Microelectronics Co., Ltd. Shanghai Branch, Shanghai (CN)

( * ) Notice: Subject to any disclaimer, the term of this patent is extended or adjusted under 35 U.S.C. 154(b) by 84 days.

(21) Appl. No.: 18/968,306

(22) Filed: Dec. 4, 2024

(65) Prior Publication Data

US 2025/0098085 A1 Mar. 20, 2025

(30) Foreign Application Priority Data

Dec. 18, 2023 (CN) .......................... 202311745793.5

(51) Int. Cl.
| | |
|---|---|
| *G06F 1/16* | (2006.01) |
| *H05K 5/00* | (2006.01) |
| *H05K 5/02* | (2006.01) |

(52) U.S. Cl.
CPC ......... *H05K 5/0221* (2013.01); *H05K 5/0086* (2013.01)

(58) Field of Classification Search
None
See application file for complete search history.

(56) References Cited

U.S. PATENT DOCUMENTS

| | | | | |
|---|---|---|---|---|
| 6,035,035 | A * | 3/2000 | Firooz ................. | H04M 1/0247 |
| | | | | 379/433.1 |
| 6,158,884 | A * | 12/2000 | Lebby .................... | H04B 1/385 |
| | | | | 368/204 |
| 8,014,635 | B2 * | 9/2011 | Kondo ................... | H04N 19/98 |
| | | | | 382/312 |
| 9,323,287 | B2 * | 4/2016 | Cheng ................... | G06F 1/1675 |
| 9,495,125 | B2 * | 11/2016 | He ...................... | G02B 27/0101 |
| 9,519,142 | B2 * | 12/2016 | He .......................... | G02B 27/01 |
| 9,523,964 | B2 * | 12/2016 | Zhang .................. | G04G 17/045 |

(Continued)

FOREIGN PATENT DOCUMENTS

| | | |
|---|---|---|
| CN | 206348606 U | 1/2021 |
| CN | 111176104 B | 9/2021 |

*Primary Examiner* — Xanthia C Relford
*Assistant Examiner* — Xanthia C Cunningham
(74) *Attorney, Agent, or Firm* — KDW Firm PLLC

(57) ABSTRACT

Provided is a display device, which relates to the technical field of electronic devices. The display device includes a fixed structure, a first display screen, an external display screen, and a movable support. The first display screen is disposed on the fixed structure, and the movable support is movably disposed on the fixed structure. The display device has at least a first state and a second state. In the first state, an orthographic projection of the movable support on a plane where the first display screen is located is within a range of the first display screen. In the second state, the orthographic projection of the movable support on the plane where the first display screen is located is at least partially outside the range of the first display screen to support the external display screen configured to be spliced with the first display screen.

20 Claims, 16 Drawing Sheets

(56) References Cited

U.S. PATENT DOCUMENTS

| | | | | |
|---|---|---|---|---|
| 9,857,773 | B1 * | 1/2018 | Tang | G04G 9/0088 |
| 10,057,998 | B1 * | 8/2018 | Jiang | G06F 1/1656 |
| 10,338,641 | B2 * | 7/2019 | Xia | G06F 1/1635 |
| 10,481,638 | B2 * | 11/2019 | Yoshizumi | G06F 1/1624 |
| 10,725,499 | B1 * | 7/2020 | Wan | G06F 1/163 |
| 10,739,819 | B2 * | 8/2020 | Arshad | G06F 1/1641 |
| 11,003,211 | B2 * | 5/2021 | Lin | G06F 1/1652 |
| 11,429,151 | B2 * | 8/2022 | Connor | G06F 1/1641 |
| 11,747,769 | B2 * | 9/2023 | Connor | G04G 17/08 |
| | | | | 368/10 |
| 11,971,747 | B2 * | 4/2024 | Wu | G06F 1/163 |
| 12,287,670 | B2 * | 4/2025 | Zigras | G06F 1/1652 |
| 12,346,156 | B2 * | 7/2025 | Connor | G06F 1/3265 |
| 2006/0209218 | A1 * | 9/2006 | Lee | G04G 17/08 |
| | | | | 349/1 |
| 2009/0219788 | A1 * | 9/2009 | Henley, Jr. | G04G 21/04 |
| | | | | 455/556.1 |
| 2014/0337621 | A1 * | 11/2014 | Nakhimov | H04W 12/068 |
| | | | | 713/168 |
| 2015/0029227 | A1 * | 1/2015 | Park | G06F 1/163 |
| | | | | 345/659 |
| 2015/0049000 | A1 * | 2/2015 | He | G06F 3/1423 |
| | | | | 345/1.3 |
| 2015/0049066 | A1 * | 2/2015 | He | G06F 1/1637 |
| | | | | 345/204 |
| 2016/0124395 | A1 * | 5/2016 | Lee | H04M 1/0268 |
| | | | | 368/239 |
| 2016/0246558 | A1 * | 8/2016 | Prushinskiy | G06F 3/1431 |
| 2016/0357158 | A1 * | 12/2016 | Kim | G04G 21/06 |
| 2018/0120901 | A1 * | 5/2018 | Jin | G06F 1/1677 |
| 2020/0042037 | A1 * | 2/2020 | Sun | G06F 1/1652 |
| 2020/0133333 | A1 * | 4/2020 | Arshad | G06F 1/1643 |
| 2020/0218312 | A1 * | 7/2020 | Connor | G06F 1/1641 |
| 2023/0384825 | A1 * | 11/2023 | Connor | G06F 3/041 |

* cited by examiner

DISPLAY DEVICE

CROSS-REFERENCE TO RELATED APPLICATION

This application claims priority to Chinese patent application No. 202311745793.5 filed with the CNIPA on Dec. 18, 2023, the disclosure of which is incorporated herein by reference in its entirety.

TECHNICAL FIELD

The present disclosure relates to the technical field of electronic devices and, in particular, to a display device.

BACKGROUND

In recent years, smart wearable products have developed rapidly. The smart wearable products include, for example, a smart watch. The smart watch is easy to carry and convenient to use and has a good application prospect. However, the current smart watch has a relatively small screen and has a relatively single function compared to common large-screen smart devices. The current smart watch has a single industrial design (ID) and a relatively single usage scenario, affecting user experience.

SUMMARY

Based on the preceding problems, the present disclosure aims to provide a display device, which has not only conventional display functions but also extended display functions and thus meets the needs of a user in diversified usage scenarios.

To achieve the preceding object, the present disclosure adopts the technical solutions below.

A display device includes a fixed structure, a first display screen disposed on the fixed structure, an external display screen, and a movable support movably disposed on the fixed structure.

The display device has at least a first state and a second state. In the first state, the orthographic projection of the movable support on the plane in which the first display screen is located is within the range of the first display screen. In the second state, the orthographic projection of the movable support on the plane where the first display screen is located is at least partially outside the range of the first display screen so that the movable support supports the external display screen configured to be spliced with the first display screen.

BRIEF DESCRIPTION OF DRAWINGS

To illustrate technical solutions in embodiments of the present disclosure more clearly, the drawings used in the description of the embodiments of the present disclosure are described briefly hereinafter. Apparently, the drawings described hereinafter illustrate part of embodiments of the present disclosure, and those of ordinary skill in the art may obtain other drawings based on the embodiments of the present disclosure and the drawings described below on the premise that no creative work is done.

REFERENCE LIST

Figure 1:
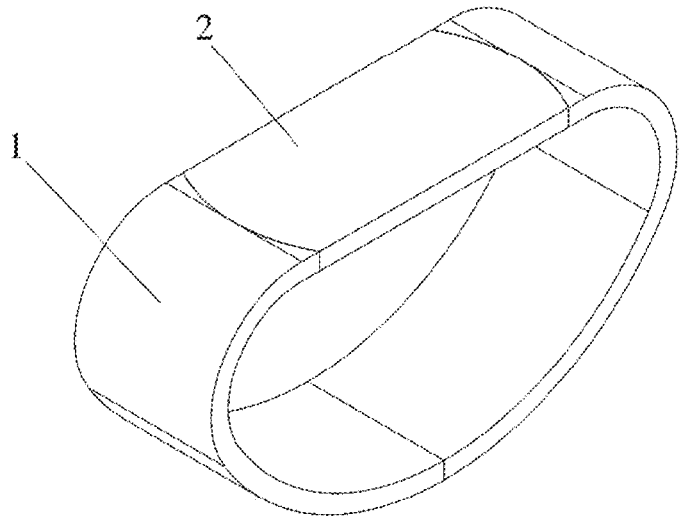
FIG. 1 is a structural view of a fixed structure and a first display screen in a display device according to an embodiment of the present disclosure.
Figure 2:
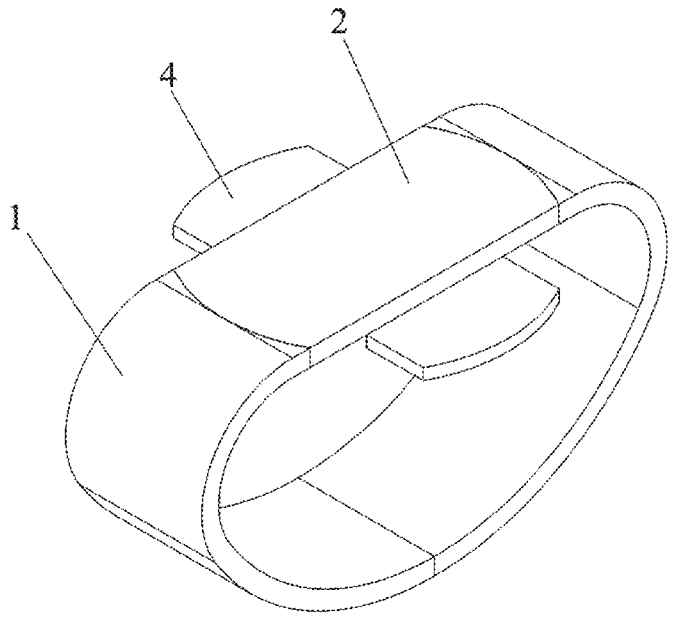
FIG. 2 is a structural view of a fixed structure, a first display screen, and a movable support in a display device according to an embodiment of the present disclosure.
Figure 3:
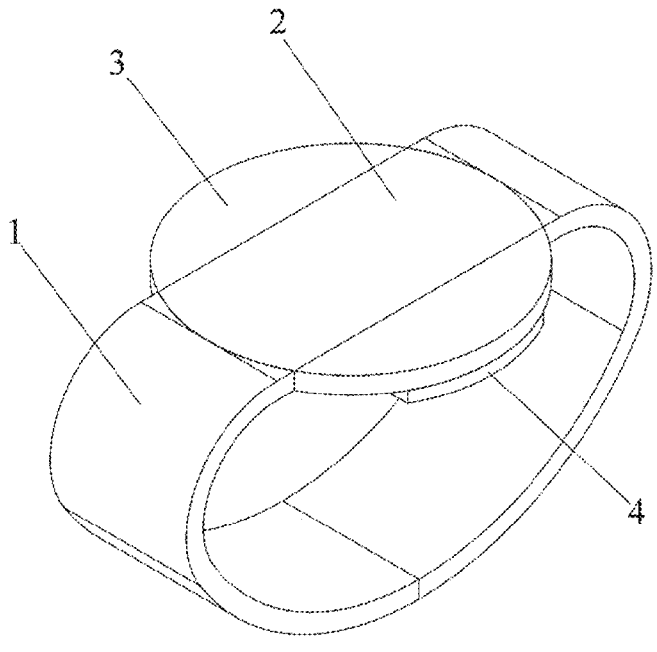
FIG. 3 is a structural view of a fixed structure, a first display screen, an external display screen, and a movable support in a display device according to an embodiment of the present disclosure.
Figure 4:
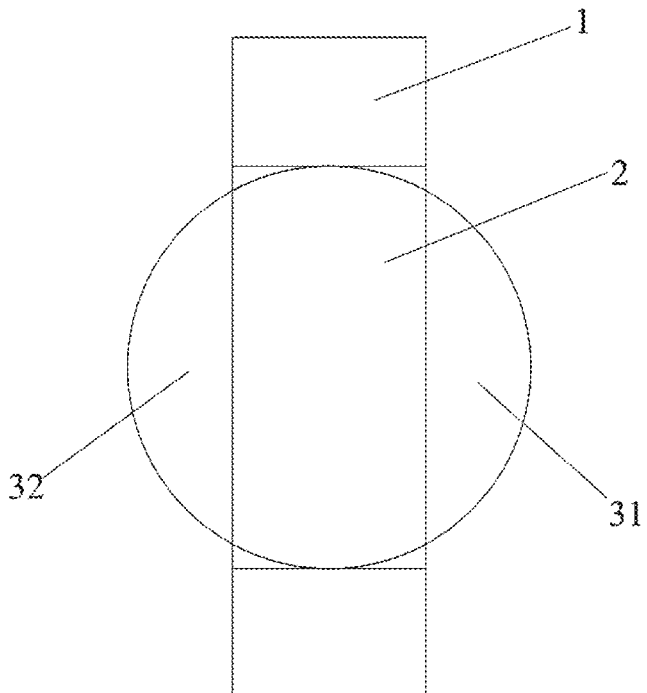
FIG. 4 is a structural view of a fixed structure, a first display screen, a first external screen, and a second external screen in a display device according to an embodiment of the present disclosure.

1 fixed structure
2 first display screen
3 external display screen
4 movable support
5 front-facing camera
6 spindle
11 body part
12 first flexible part
13 second flexible part
14 damping groove
15 linear groove
16 arc-shaped groove
17 first positioning protrusion
18 second positioning groove
31 first external screen
32 second external screen
33 first screen
34 second screen
35 second positioning protrusion
36 third positioning groove
37 second locking structure
38 second connector
41 first support plate
411 first avoidance surface
42 second support plate
421 second avoidance surface
43 first locking structure
44 damping protrusion
45 slider

46 sliding protrusion
47 first positioning groove
48 third positioning protrusion
49 first connector
410 sensor avoidance opening

DETAILED DESCRIPTION

To make solved technical problems, adopted technical solutions, and achieved technical effects of the present disclosure clearer, the technical solutions in embodiments of the present disclosure are further described in detail below in conjunction with the drawings. Apparently, the embodiments described below are part, not all, of the embodiments of the present disclosure. Based on the embodiments of the present disclosure, all other embodiments obtained by those skilled in the art on the premise that no creative work is done are within the scope of the present disclosure.

In the description of the present disclosure, it is to be noted that orientations or position relations indicated by terms such as "center", "upper", "lower", "left", "right", "vertical", "horizontal", "in", and "out" are based on the drawings. These orientations or position relations are intended only to facilitate and simplify the description of the present disclosure and not to indicate or imply that a device or element referred to must have such particular orientations or must be configured or operated in such particular orientations. Thus, these orientations or position relations are not to be construed as limiting the present disclosure. Moreover, terms such as "first" and "second" are used only for the purpose of description and are not to be construed as indicating or implying relative importance. Terms "first position" and "second position" indicate two different positions.

In the description of the present disclosure, it is to be noted that terms "mounted", "joined", and "connected" are to be understood in a broad sense unless otherwise expressly specified and limited. For example, the term "connected" may refer to "securely connected" or "detachably connected", may refer to "mechanically connected" or "electrically connected", or may refer to "connected directly", "connected indirectly through an intermediary", or "connected inside two components". For those of ordinary skill in the art, specific meanings of the preceding terms in the present disclosure may be understood based on specific situations.

As shown in FIGS. 1 to 31, the embodiment provides a display device, which may be a wearable device such as a sports bracelet. The display device includes a fixed structure 1, a first display screen 2, an external display screen 3, and a movable support 4. The first display screen 2 is disposed on the fixed structure 1, and the movable support 4 is movably disposed on the fixed structure 1. The fixed structure 1 may be understood as a housing-like structure of the display device, such as a body part 11 and a strap part of the sports bracelet. The first display screen 2 may be used as a main display screen of the display device to implement display functions of conventional applications, for example, display information of the sports bracelet such as time, a heart rate, and an incoming call reminder. The external display screen 3 may be used as a secondary display screen of the display device to implement extended display functions together with the main display screen, for example, a circular watch, a large audiovisual screen, foldable screen photographing, and other functions added on the basis of the sports bracelet. The display device has at least a first state and a second state. In the first state, an orthographic projection of the movable support 4 on a plane where the first display screen 2 is located is within a range of the first display screen 2. In the second state, the orthographic projection of the movable support 4 on the plane where the first display screen 2 is located is at least partially outside the range of the first display screen 2 so that the movable support 4 supports the external display screen 3 configured to be spliced with the first display screen 2. It is to be understood that the main difference between the first state and the second state of the display device is that in the first state, the display device can implement conventional display functions, and in the second state, the display device can implement extended display functions.

Since the movable support 4 is movably disposed on the fixed structure 1, in the first state, the orthographic projection of the movable support 4 on the plane where the first display screen 2 is located is within the range of the first display screen 2 so that the movable support 4 can be hidden under the first display screen 2 and does not affect the conventional display functions of the display device, such as conventional display functions of the sports bracelet. In the second state, the orthographic projection of the movable support 4 on the plane where the first display screen 2 is located is at least partially outside the range of the first display screen 2 so that the movable support 4 supports the external display screen 3 configured to be spliced with the first display screen 2. The extended display functions of the display device are implemented through the external display screen 3, for example, the extended display functions such as a circular business watch, a rectangular audiovisual screen, and a foldable screen are added on the basis of the sports bracelet, thereby meeting needs of a user in different scenarios, improving user experience, and providing a new product easily recognizable and applicable to a wide range of users and rich scenarios.

Figure 16:
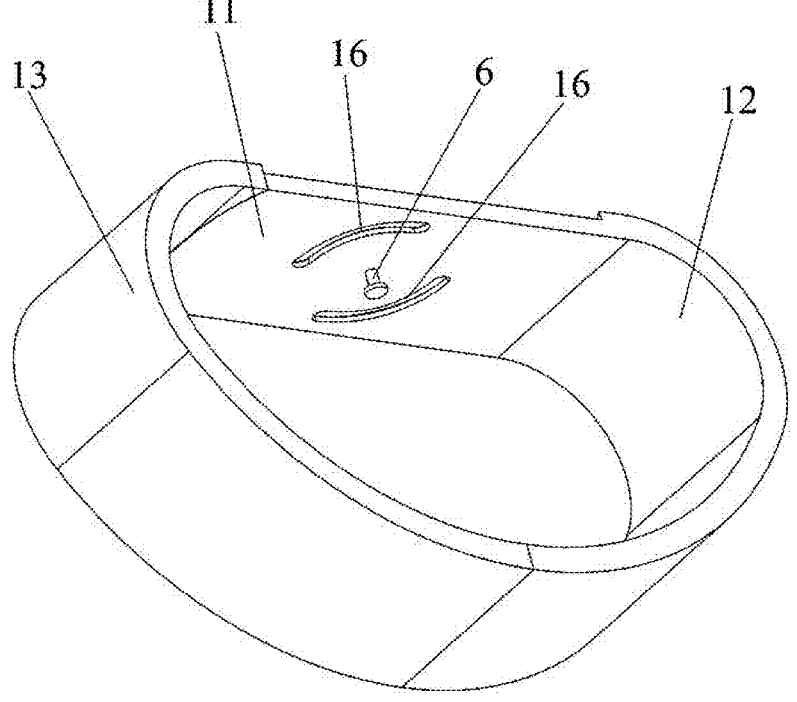
FIG. 16 is a structural view of a fixed structure according to an embodiment of the present disclosure, where the fixed structure is provided with arc-shaped grooves.
Figure 17:
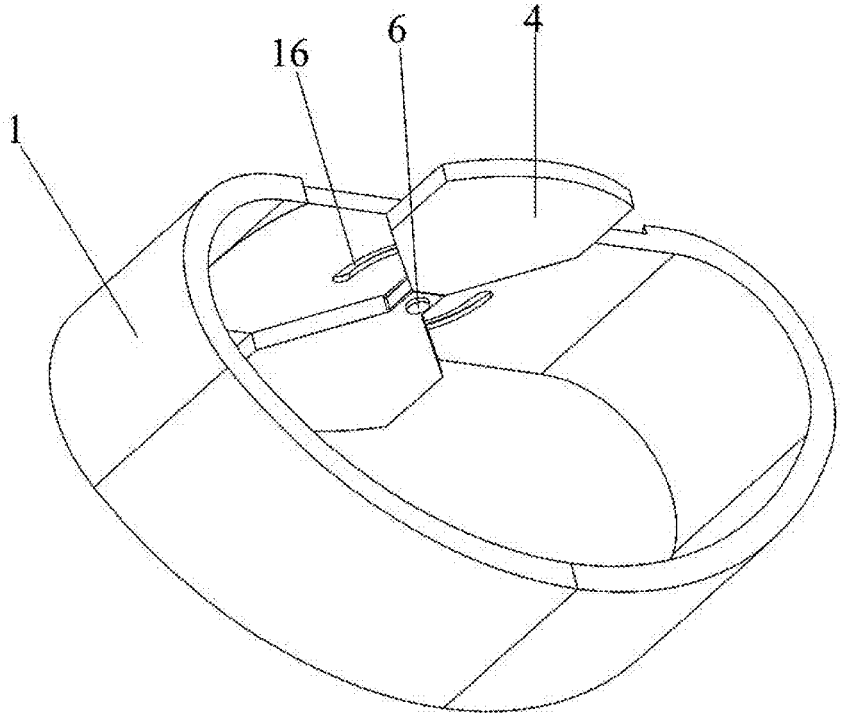
FIG. 17 is a structural view of a fixed structure and a movable support according to an embodiment of the present disclosure from another perspective.

Existing wearable devices cannot meet application needs in different scenarios, for example, the sports bracelet has a single appearance, is applicable to a sports scenario, and does not appear formal enough in a formal business activity. To solve this problem, in some embodiments, as shown in FIGS. 3 to 6, the movable support 4 may include a first support plate 41 and a second support plate 42, and the external display screen 3 includes a first external screen 31 and a second external screen 32, where the first support plate 41 and the second support plate 42 are movably disposed on the fixed structure 1 separately, the first support plate 41 is movable to a first support position to support the first external screen 31, the second support plate 42 is movable to a second support position to support the second external screen 32, and the first display screen 2, the first external screen 31, and the second external screen 32 may be spliced into a first spliced screen. A structural form of the first support plate 41 and the second support plate 42 is adopted so that the structural design of the movable support 4 is simplified, thus reducing the manufacturing cost of the entire display device. Both the first support plate 41 and the second support plate 42 adopt a plate-like structure, which can reduce an occupied space and improve the wearing comfort of the user. Both the first support plate 41 and the second support plate 42 may be rotatably disposed on the fixed structure 1. For example, the first support plate 41 and the second support plate 42 are rotatably connected to the fixed structure 1 through their respective spindles, or the first support plate 41 and the second support plate 42 share the same spindle 6 (as shown in FIGS. 16 and 17). The first support plate 41 and the second support plate 42 may separately rotate by 90° from an initial position to a target position and then support the first external screen 31 and the second external screen 32 respectively. The first spliced screen may be a display screen in the shape of a circular dial and thus appears formal and classic in some formal business cooperation occasions. It is to be noted that the initial position refers to a position at which the first support plate 41 and the second support plate 42 are completely hidden under the body part 11. In the rotation process of the first support plate 41 and the second support plate 42, the first support plate 41 and the second support plate 42 are gradually exposed outside the body part 11. The target position refers to a position at which the first support plate 41 and the second support plate 42 are exposed outside the body part 11 to the maximum. With this setting, in the first state, the display device can have convenient and dynamic attributes of the sports bracelet, and in the second state, the display device can be deformed and sliced into a traditional classic circular watch with business attributes, thus meeting the needs of the user in different scenarios and improving the user experience.

Figure 5:
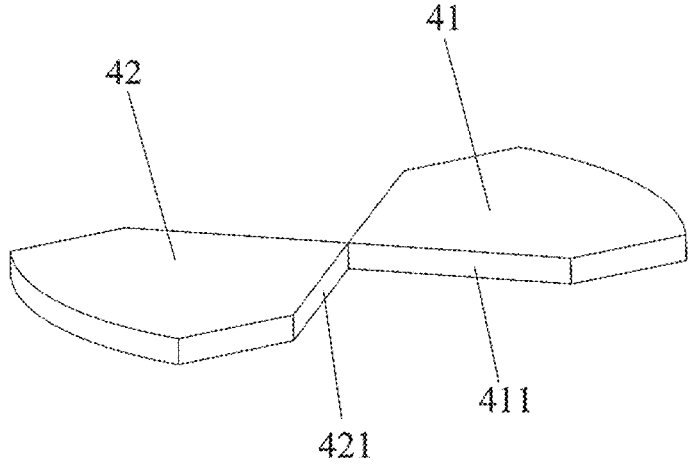
FIG. 5 is a structural view of a first support plate and a second support plate in a display device according to an embodiment of the present disclosure.
Figure 6:
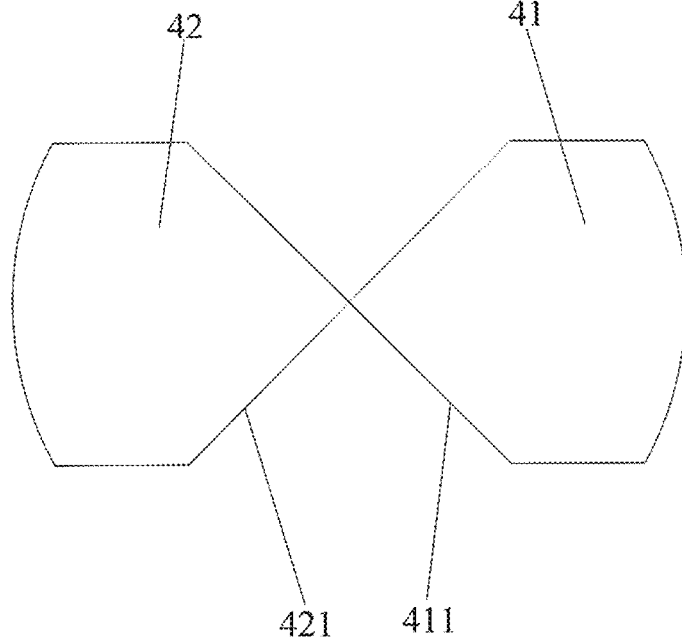
FIG. 6 is a top view of a first support plate and a second support plate in a display device according to an embodiment of the present disclosure.
Figure 7:
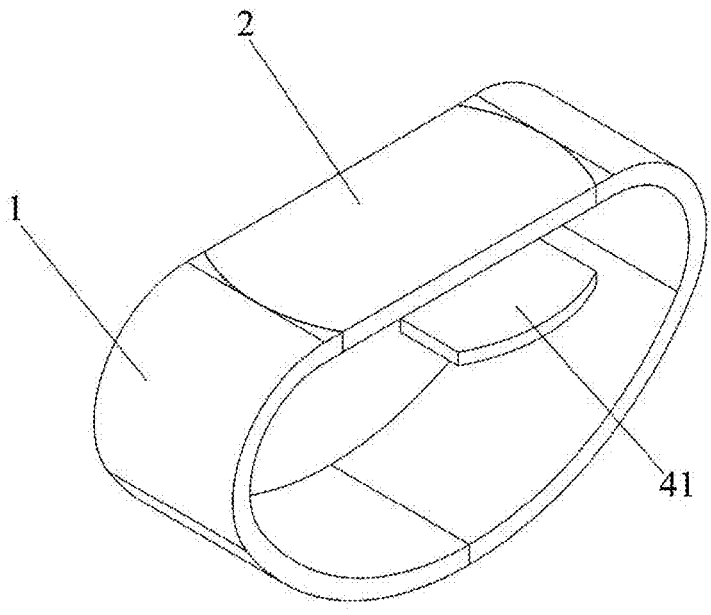
FIG. 7 is a structural view of a fixed structure, a first display screen, and a first support plate in a display device according to an embodiment of the present disclosure.
Figure 8:
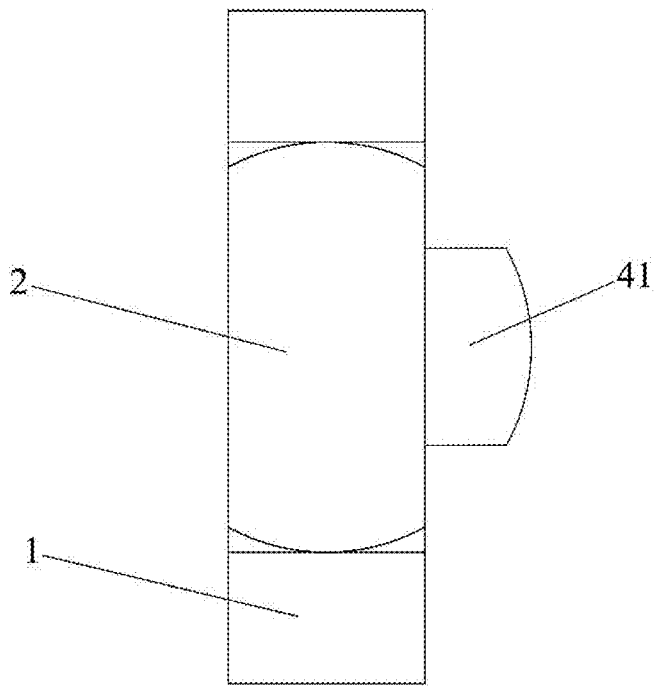
FIG. 8 is a top view of a fixed structure, a first display screen, and a first support plate according to an embodiment of the present disclosure.
Figure 9:
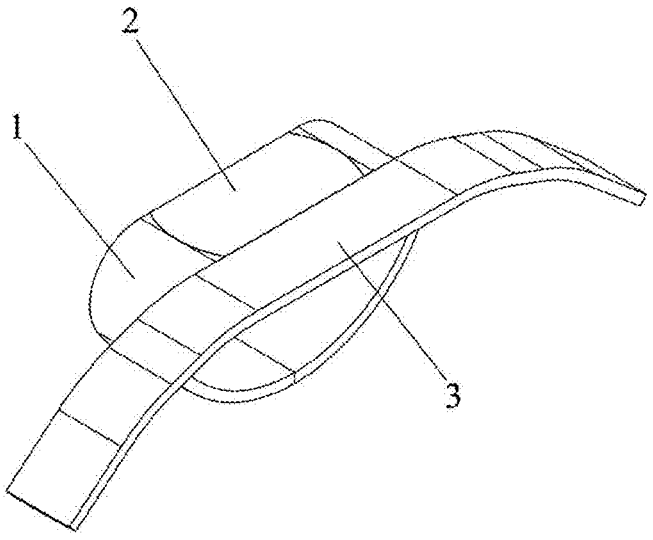
FIG. 9 is a structural view of a fixed structure, a first display screen, and a strip-shaped external display screen according to an embodiment of the present disclosure.

To prevent interference between the first support plate 41 and the second support plate 42, in an embodiment, the first support plate 41 and the second support plate 42 are rotatably disposed on the fixed structure 1 separately. As shown in FIGS. 5 and 6, the first support plate 41 is provided with a first avoidance surface 411, the second support plate 42 is provided with a second avoidance surface 421, and an avoidance gap is formed between the first avoidance surface 411 and the second avoidance surface 421. In the first state, the included angle between the first avoidance surface 411 and the second avoidance surface 421 is greater than or equal to 90°. When one of the first support plate 41 and the second support plate 42 rotates and the other does not rotate, the design of the avoidance gap can effectively avoid the interference between the first support plate 41 and the second support plate 42. Since the included angle between the first avoidance surface 411 and the second avoidance surface 421 is greater than or equal to 90°, even if the first support plate 41 and the second support plate 42 rotate by 90° from the initial position to the target position, there is still avoidance room between the first support plate 41 and the second support plate 42. To prevent the user from being scratched, outer edges of the first support plate 41 and the second support plate 42 may be arc-shaped.

Existing sports bracelets have narrow screens which are not suitable for playing movies and television shows due to their dimensions and ratios and thus cannot provide timely entertainment and have a single function and application scenario. To solve this problem, in some embodiments, as shown in FIGS. 7 to 10, the movable support 4 may include the first support plate 41, where the first support plate 41 is movably disposed on the fixed structure 1, the first support plate 41 is movable to a third support position to support the external display screen 3, and the first display screen 2 and the external display screen 3 may be spliced into a second spliced screen. A structural form of the first support plate 41 is adopted so that the structural design of the movable support 4 is simplified, thus reducing the manufacturing cost of the entire display device. The first support plate 41 adopts a plate-like structure, which can reduce the occupied space and improve the wearing comfort of the user. The first support plate 41 is rotatably disposed on the fixed structure 1, for example, rotatably connected to the fixed structure 1 through a spindle. The first support plate 41 may rotate by 90° from the initial position to the target position and then support the external display screen 3. Since the first display screen 2 and the external display screen 3 are spliced into the second spliced screen, the display area can be increased and more display requirements of the user can be met. For example, movie watching has a relatively high requirement on the display area, and general sports bracelets cannot meet this requirement. The second spliced screen may be a square screen or a rectangular screen, which is determined according to the requirement of the user. It is to be understood that the movable support 4 may include only the first support plate 41, which is sufficient to support the external display screen 3, or the movable support 4 may include both the first support plate 41 and the second support plate 42, where the first support plate 41 supports the external display screen 3, and the second support plate 42 may be idle or spare.

Figure 10:
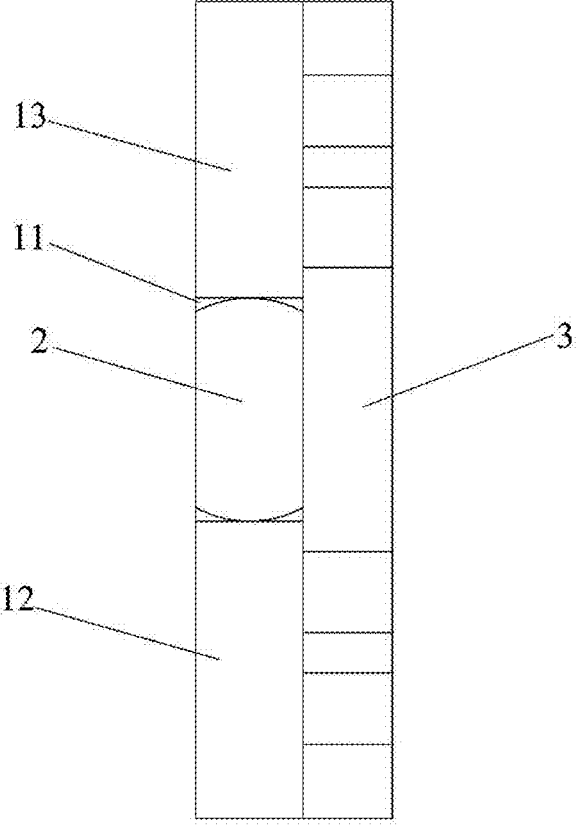
FIG. 10 is a top view of a fixed structure, a first display screen, and a strip-shaped external display screen according to an embodiment of the present disclosure.

As shown in FIG. 10, to further increase the display area of the display device, in an embodiment, the fixed structure 1 includes the body part 11, a first flexible part 12, and a second flexible part 13, where an end of the first flexible part 12 and an end of the second flexible part 13 are each connected to the body part 11, the other end of the first flexible part 12 and the other end of the second flexible part 13 are detachably connected, the first flexible part 12 is provided with a first flexible screen, the second flexible part 13 is provided with a second flexible screen, and the first display screen 2, the first flexible screen, the second flexible screen, and the external display screen 3 may be spliced into a third spliced screen. The body part 11 is configured to support the first display screen 2, and the first flexible part 12 and the second flexible part 13 may be configured to fix the display device to a human body for easy carrying. The first flexible part 12 and the second flexible part 13 made of flexible materials also enhances the wearing comfort of the user. The setting of the first flexible screen and the second flexible screen can increase the display area of the display device and provide the user with more information display functions. Since the first display screen 2, the first flexible screen, the second flexible screen, and the external display screen 3 are spliced into the third spliced screen, the display area can be increased and more display requirements of the user can be met. For example, movie watching has a relatively high requirement on the display area, and the third spliced screen may be a widescreen with an aspect ratio of 16:9, which can enhance the viewing experience of the user. The setting of the third spliced screen allows the user to enjoy moderate entertainment or watch instructional videos during breaks in exercises, facilitating the next steps in the exercise. For ease of understanding, when the display device is the sports bracelet, the body part 11 is a housing structure of the bracelet, and the first flexible part 12 and the second flexible part 13 are the strap structure of the bracelet.

Both the first flexible screen and the second flexible screen may be made of the following flexible materials: polyvinyl alcohol (PVA), polyethylene terephthalate (PET), polyimide (PI), polyethylene naphthalate (PEN), paper, and textile materials. The PI material has the advantages of high temperature resistance, low temperature resistance, chemical resistance, and good electrical properties, making it the most potential material for flexible electronics. In addition to the characteristic of high temperature resistance in the selection of flexible substrates, the light transmittance, surface roughness, and material costs of the flexible substrates are factors to be considered in the selection. Polydimethylsiloxane (PDMS) is also a widely recognized flexible material and has the advantages of easy access, stable chemical properties, transparency, and good thermal stability. In particular, an adhesive region and a non-adhesive region are distinct under ultraviolet light, and this characteristic makes the surface of PDMS easy to adsorb electronic materials.

Although PET has a low conversion temperature of about 70° C. to 80° C., PET is cheap, has good light transmittance, and is a highly cost-effective material for transparent conductive films.

The first flexible screen and the second flexible screen are each a flexible display screen. The flexible display screen refers to a flexible organic light-emitting diode (OLED). The OLED is very thin and is able to be mounted on a flexible material such as plastics or a metal foil. The use of plastics instead of glass makes the display screen more durable and lighter. A flexible OLED panel is concave from top to bottom, with a bending radius of up to 700 millimeters. The OLED uses a plastic substrate instead of a common glass substrate. Thin-film encapsulation technology is adopted and a protective film is stuck to the back of the panel so that the panel is bendable and less prone to being broken.

An OLED device is composed of a substrate, a cathode, an anode, a hole injection layer (HIL), an electron injection layer (EIL), a hole transport layer (HTL), an electron transport layer (ETL), an electron blocking layer (EBL), a hole blocking layer (HBL), and an emissive layer (EML). The substrate serves as the foundation for the entire device, and all functional layers need to be deposited on the substrate of the device. Glass is commonly used as the substrate of the device. However, if a bendable flexible OLED device needs to be manufactured, other materials such as plastics need be used as the substrate of the device. The anode is connected to a positive electrode of the device to which a drive voltage is applied, and holes in the anode move towards the emissive layer of the device under the applied drive voltage. The cathode is transparent, allowing the light emitted from the interior of the device to be observed externally. The cathode is made of a MgAg alloy.

The hole injection layer is able to modify the anode of the device and allows the holes from the anode to be smoothly injected into the hole transport layer. The hole transport layer is responsible for transporting holes to the emissive layer. The electron blocking layer blocks electrons from the cathode at an interface of the emissive layer of the device, increasing the concentration of electrons at the interface of the emissive layer of the device. The emissive layer is a layer where electrons and holes of the device recombine into excitons, and the excitons are then de-excited to emit light. The hole blocking layer blocks the holes from the anode at an interface of the emissive layer of the device, thereby increasing the probability of recombination of electrons and holes at the interface of the emissive layer of the device and increasing the luminescence efficiency of the device. The electron transport layer is responsible for transporting the electrons from the cathode to the emissive layer of the device. The electron injection layer acts to modify the cathode and transport electrons to the electron transport layer. Electrons in the cathode move towards the emissive layer of the device under the applied drive voltage of the device and recombine with the holes from the anode in the emissive layer.

Compared to traditional screens, the flexible display screen has significant advantages. The flexible display screen is lighter and thinner in volume and has lower power consumption than original devices, improving the battery life of the device. Meanwhile, due to its bendability and good flexibility, the flexible display screen is much more durable than traditional screens, reducing the probability of accidental damage to the device. A foldable screen is required to remain good after being bent 200,000 times and is a flexible screen with a relatively high requirement on flexibility. The structure of the foldable screen needs to be designed separately.

Figure 11:
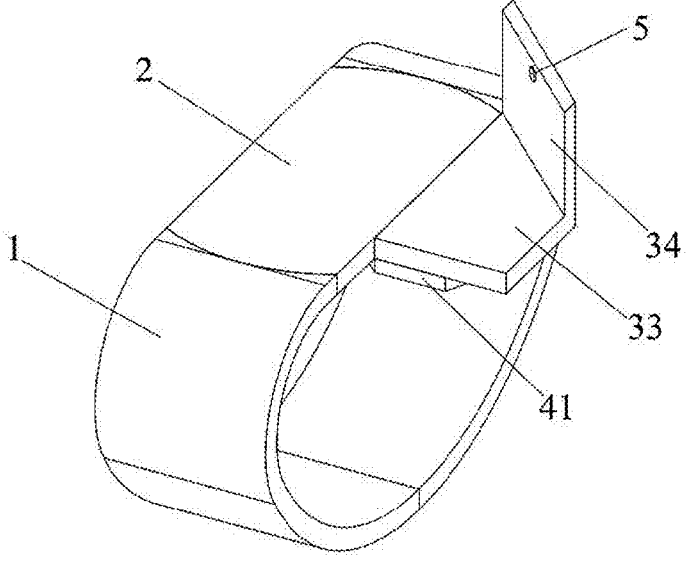
FIG. 11 is a structural view of a fixed structure, a first display screen, a foldable screen, and a front-facing camera according to an embodiment of the present disclosure.
Figure 12:
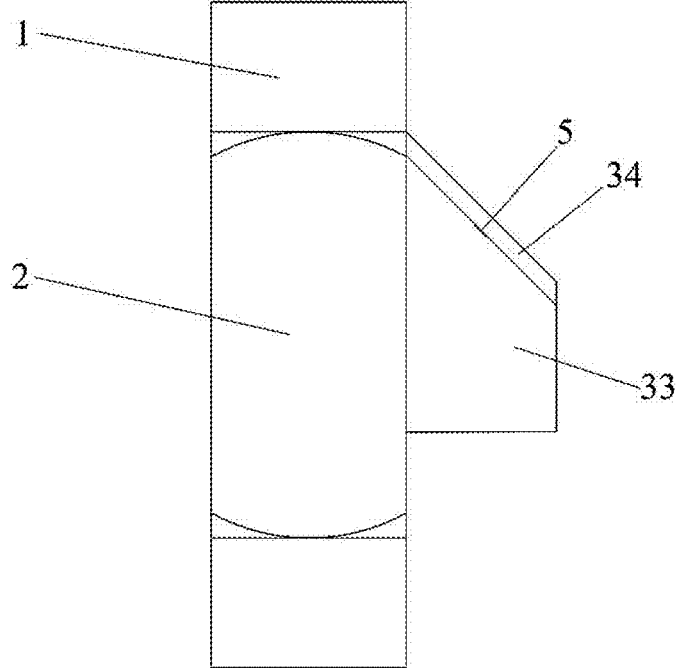
FIG. 12 is a top view of a fixed structure, a first display screen, a foldable screen, and a front-facing camera according to an embodiment of the present disclosure, where a folding seam is parallel to a side of the first display screen.
Figure 13:
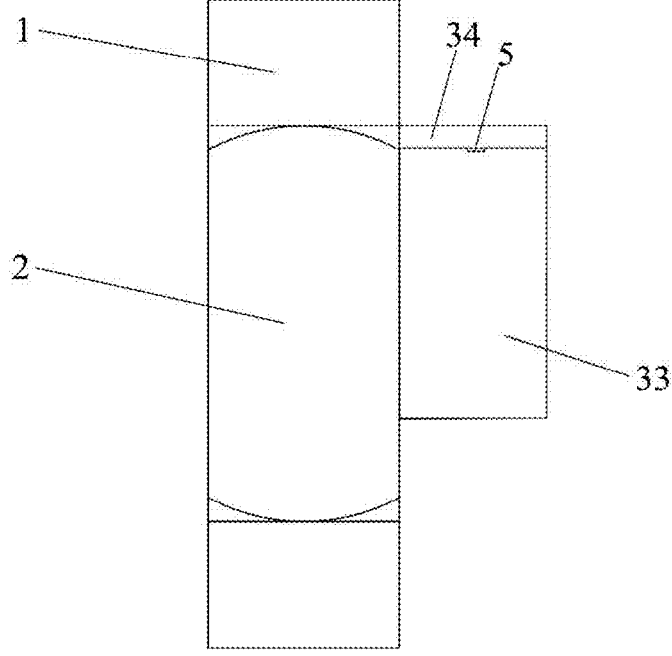
FIG. 13 is a top view of a fixed structure, a first display screen, a foldable screen, and a front-facing camera according to an embodiment of the present disclosure, where a folding seam is perpendicular to a side of the first display screen.

In order that a screen of an existing sports bracelet worn on the wrist is viewed for a long time, an arm needs to be maintained at a fixed position for a relatively long time, which is tiring. To solve this problem, in some embodiments, as shown in FIGS. 11 to 13, the external display screen 3 is a foldable screen. The use of the foldable screen can well resolve the problem where the use is prone to fatigue due to the fixed arm position. The angle of the foldable screen may be adjusted, and then the position of the arm is changed, allowing the user to relax the arm freely and improving the user experience. Moreover, the foldable screen has advantages in split-screen applications, enabling the user to perform multi-screen operations in multi-application scenarios.

When the existing sports bracelet is worn on the wrist, the sports bracelet needs to be taken off if photographing or a video call needs to be performed by using a camera at the top of the screen, which is inconvenient to operate. Otherwise, photographing with the sports bracelet worn requires an unnatural and non-ergonomic twisting motion of the arm. To solve this problem, in an embodiment, a front-facing camera 5 and/or a rear-facing camera are disposed on the foldable screen. The front-facing camera 5 on the foldable screen is used for the video call, or the rear-facing camera on the foldable screen is used for photographing, which can reduce the movement difficulty of the arm, alleviate the fatigue of the arm, and allow the user to quickly and timely complete the photographing or the video call without taking off the sports bracelet, making the operation convenient and natural. The number of front-facing cameras 5 and the number of rear-facing cameras may be determined according to requirements of the user, which are not limited here.

As shown in FIGS. 11 to 13, in an embodiment, the foldable screen includes a first screen 33 and a second screen 34 arranged at an angle, where the first screen 33 and the first display screen 2 are disposed in the same plane. The first screen 33 is supported by the first support plate 41. Since the first screen 33 and the first display screen 2 are disposed in the same plane, the combination and splicing of the first screen 33 and the first display screen 2 can effectively increase the display area of the display device, providing the user with more convenience in various application scenarios. The second screen 34 may be unfolded to be in the same plane as the first screen 33. At this time, the first screen 33, the second screen 34, and the first display screen 2 are all in the same plane, further increasing the display area of the display device.

In an embodiment, the included angle between the folding seam between the first screen 33 and the second screen 34 and a side of the first display screen 2 ranges from 0° to 90°. The first screen 33 and the second screen 34 are folded by the folding seam. When the included angle between the folding seam and the side of the first display screen 2 is 0°, the folding seam is parallel to the side of the first display screen 2. When the included angle between the folding seam and the side of the first display screen 2 is 90°, the folding seam is perpendicular to the side of the first display screen 2. This design is applicable to different application scenarios. When the included angle between the folding seam and the side of the first display screen 2 is between 0° and 90°, such as 30°, 45°, or 60°, the movement difficulty of the arm can be reduced, making it convenient for the user to check information on the screen.

To adapt to external display screens 3 of different sizes, in an embodiment, when the movable support 4 moves relative to the fixed structure 1, a region of the orthographic projection of the movable support 4 on the plane where the first display screen 2 is located outside the range of the first display screen 2 is a support region, and the support region is adjustable in area. Since the support region is adjustable in area, the external display screen 3 supported in the support region can have more size options so that costs are properly controlled according to conventional requirements of the user.

In some embodiments, as shown in FIGS. 14 to 17, the movable support 4 is rotatably disposed on the fixed structure 1, where in the first state, the movable support 4 has a first included angle with an edge of the first display screen 2, and in the second state, the movable support 4 has a second included angle with the edge of the first display screen 2, where the first included angle and the second included angle are different. That is to say, the angle between the movable support 4 and the edge of the first display screen 2 is adjustable. The angle is adjusted so that the support region is adjustable in area. The angle may be adjusted in various manners. For example, sliding protrusions 46 mate with arc-shaped grooves 16 so that the angle between the movable support 4 and the edge of the first display screen 2 is adjusted. The sliding protrusions 46 may be disposed on the movable support 4, and the arc-shaped grooves 16 may be disposed on the fixed structure 1. Since the first display screen 2 remains stationary relative to the fixed structure 1, the sliding protrusions 46 move along an arcuate trajectory by sliding within the arc-shaped grooves 16, and thus the rotational angle of the movable support 4 is adjusted so that the angle between the movable support 4 and the edge of the first display screen 2 can be adjusted.

Figure 14:
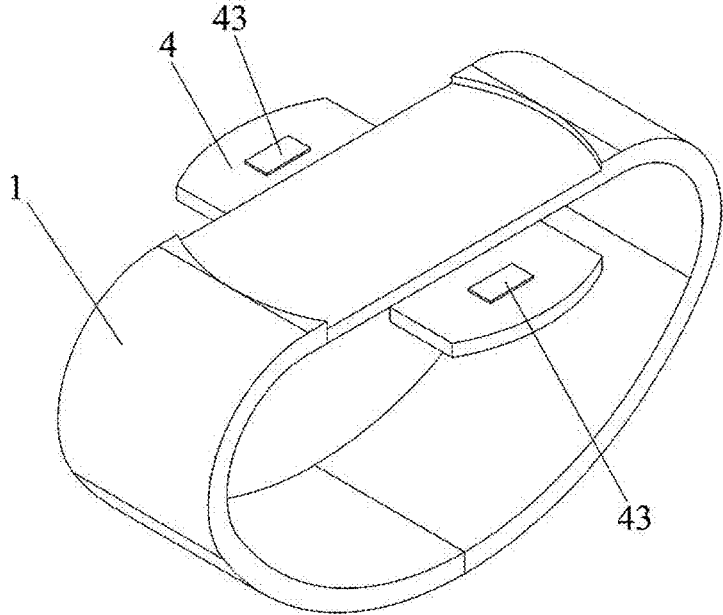
FIG. 14 is a structural view of a fixed structure and a movable support according to an embodiment of the present disclosure from a perspective.
Figure 15:
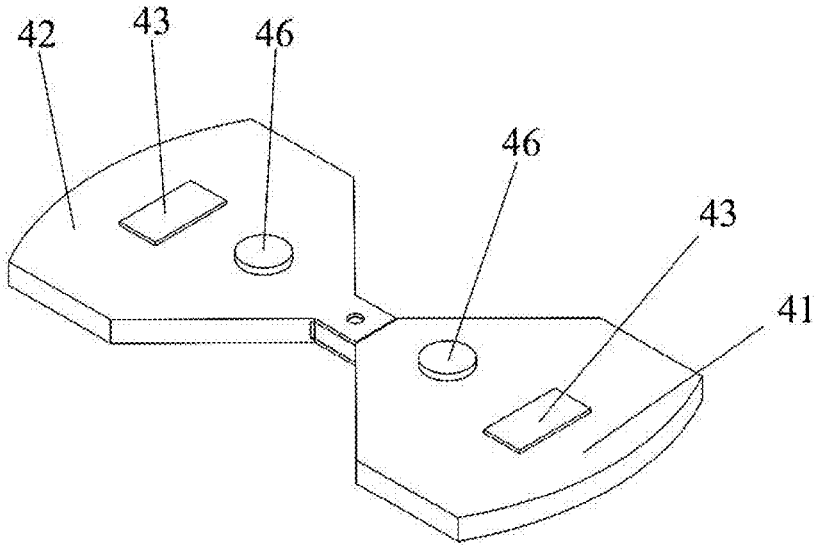
FIG. 15 is a structural view of a movable support according to an embodiment of the present disclosure, where the movable support is provided with first locking structures and sliding protrusions.
Figure 18:
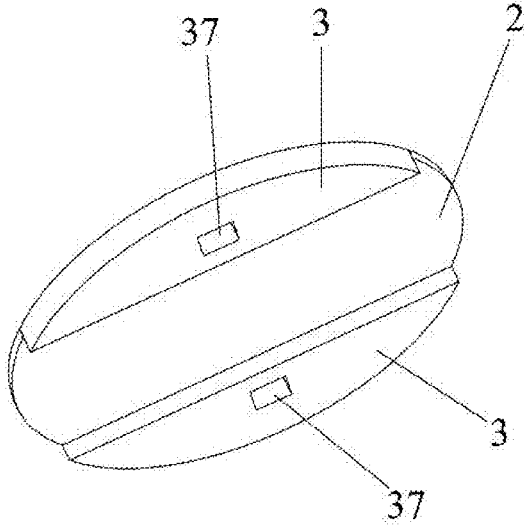
FIG. 18 is a structural view of a first display screen and an external display screen according to an embodiment of the present disclosure, where the external display screen is provided with second locking structures.
Figure 19:
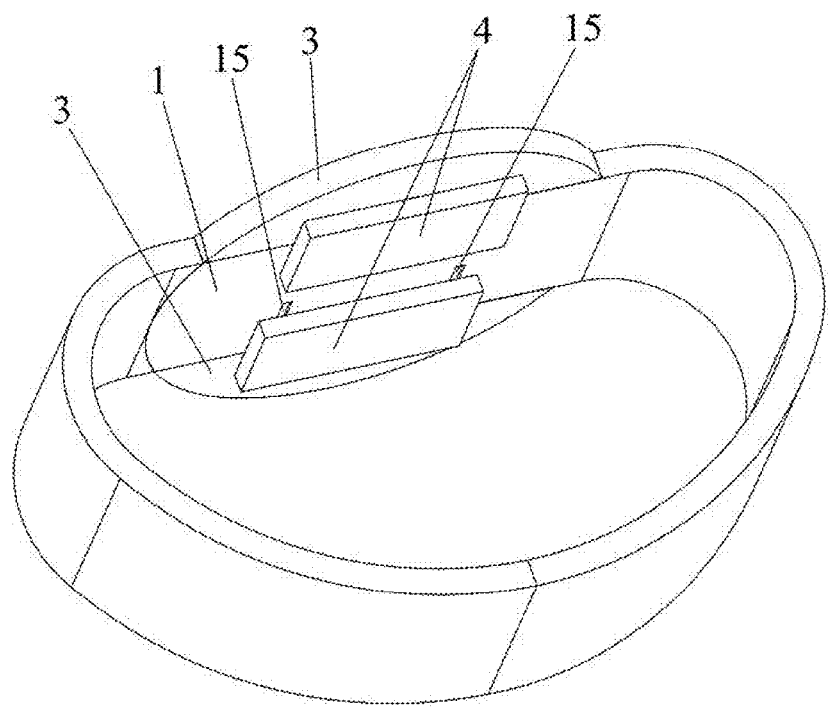
FIG. 19 is a structural view of a display device according to an embodiment of the present disclosure, where a fixed structure is provided with linear grooves.
Figure 20:
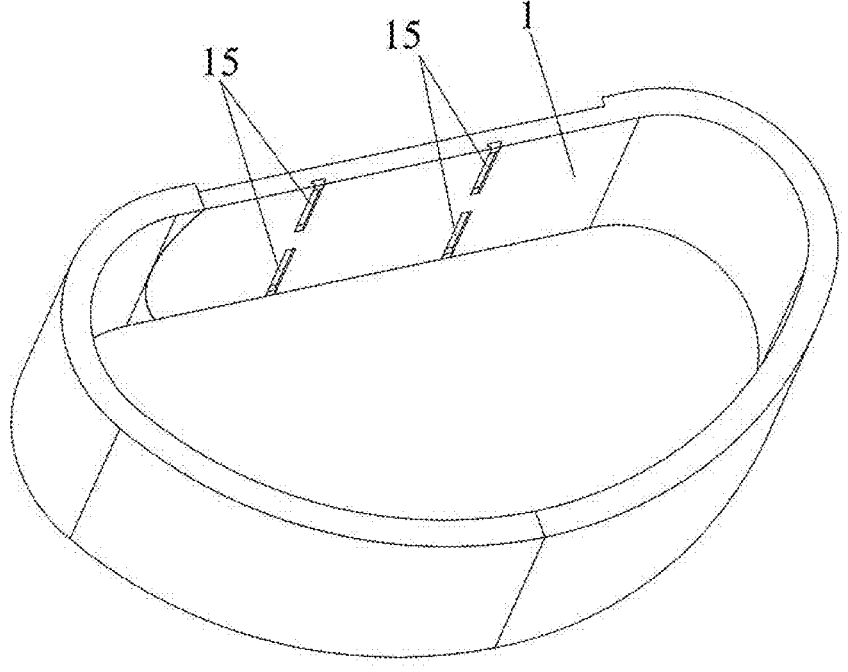
FIG. 20 is a structural view of a fixed structure according to an embodiment of the present disclosure, where the fixed structure is provided with linear grooves.
Figure 21:
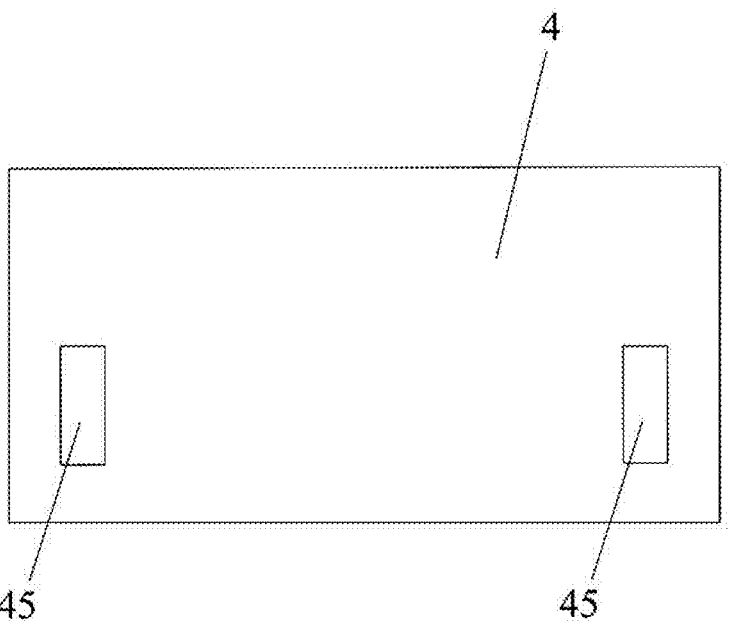
FIG. 21 is a top view of a movable support according to an embodiment of the present disclosure, where the movable support is provided with sliders.
Figure 22:
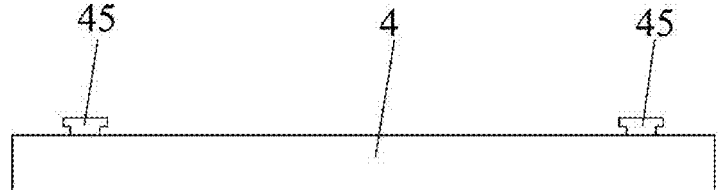
FIG. 22 is a front view of a movable support according to an embodiment of the present disclosure, where the movable support is provided with sliders.

In some embodiments, as shown in FIGS. 14, 15, and 18, when the orthographic projection of the movable support 4 on the plane where the first display screen 2 is located is within the range of the first display screen 2, the movable support 4 is locked to the fixed structure 1 through first locking structures 43, and when the orthographic projection of the movable support 4 on the plane where the first display screen 2 is located is at least partially outside the range of the first display screen 2, the movable support 4 is locked to the external display screen 3 through second locking structures 37. The first locking structures 43 and the second locking structures 37 may be mechanical locking structures, such as mating of lock pins and pinholes. Under the action of the first locking structures 43 and the second locking structures 37, the movable support 4 can be locked at a current position so that the display device is maintained in the first state or the second state, preventing the movable support 4 from shaking during the operation of the user and affecting the display effect.

In an embodiment, the first locking structures 43 and the second locking structures 37 are magnetic components. The first locking structures 43 and the second locking structures 37 use magnetic attraction for locking, achieving high safety, easy installation, and convenient operation. The magnetic components may be mounted on the movable support 4 and the fixed structure 1 by an adhesive.

In some embodiments, as shown in FIGS. 19 to 22, the movable support 4 is movably disposed on the fixed structure 1, where in the first state, the movable support 4 has a first distance from the edge of the first display screen 2, and in the second state, the movable support 4 has a second distance from the edge of the first display screen 2, where the first distance and the second distance are different. That is to say, the distance between the movable support 4 and the edge of the first display screen 2 is adjustable. The distance is adjusted so that the support region is adjustable in area. The distance may be adjusted in various manners. For example, sliders 45 mate with linear grooves 15 so that the distance between the movable support 4 and the edge of the first display screen 2 is adjusted. The sliders 45 may be disposed on the movable support 4, and the linear grooves 15 may be disposed on the fixed structure 1. Since the first display screen 2 remains stationary relative to the fixed structure 1, the sliders 45 slide within the linear grooves 15 so that the distance between the movable support 4 and the edge of the first display screen 2 can be adjusted.

Figure 23:
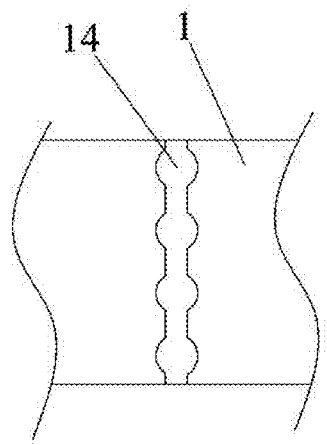
FIG. 23 is a structural view of a fixed structure according to an embodiment of the present disclosure, where the fixed structure is provided with damping grooves.
Figure 24:
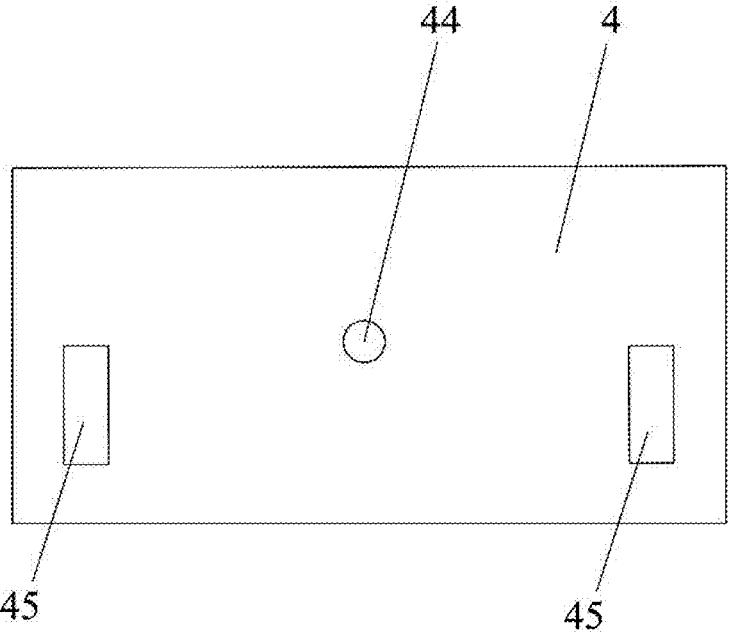
FIG. 24 is a top view of a movable support according to an embodiment of the present disclosure, where the movable support is provided with sliders and a damping protrusion.

As shown in FIGS. 23 and 24, in an embodiment, one of the movable support 4 and the fixed structure 1 is provided with a damping groove 14, and the other is provided with a damping protrusion 44 that mates with the damping groove 14. The damping protrusion 44 and the damping groove 14 are made of damping materials. When the damping protrusion 44 slides relative to the damping groove 14, the damping protrusion 44 may stay at any position so that the relative position between the movable support 4 and the fixed structure 1 can be adjusted steplessly. It is to be noted that the damping protrusion 44 and the damping groove 14 may be structures independent of the sliders 45 and the linear grooves 15 or may be integrated with the sliders 45 and the linear grooves 15. For example, the damping protrusion 44 is disposed on a slider 45, and the slider 45 may be circular, while the damping groove 14 is disposed on an inner sidewall of a linear groove 15 and in a wavy pattern. Of course, a damper may be installed between the movable support 4 and the fixed structure 1 so that the relative position between the movable support 4 and the fixed structure 1 is adjusted steplessly.

The relative position between the movable support 4 and the fixed structure 1 may be adjusted step by step and divided into several gears. In an embodiment, at least one damping protrusion 44 is provided, multiple damping grooves 14 are provided, and the damping protrusion 44 is able to mate with any one of the damping grooves 14; or at least one damping groove 14 is provided, multiple damping protrusions 44 are provided, and the damping groove 14 is able to mate with any one of the damping protrusions 44. In this setting, the damping protrusion 44 does not always mate with the damping groove 14 so that movement resistance can be reduced. When the damping protrusion 44 mates with the damping groove 14, the relative position between the movable support 4 and the fixed structure 1 is in a preset state. Since one damping protrusion 44 can mate with any one of the damping grooves 14, or one damping groove 14 can mate with any one of the damping protrusions 44, the relative position between the movable support 4 and the fixed structure 1 can achieve multi-gear adjustment.

In an embodiment, in the first state, the movable support 4 is connected to the fixed structure 1 through a first positioning structure; and in the second state, the movable support 4 is connected to the external display screen 3 through a second positioning structure. The first positioning structure and the second positioning structure may be mechanical positioning structures. Under the action of the first positioning structure and the second positioning structure, the user may relatively clearly perceive whether the movable support 4 moves in position by means of tactile perception. The first positioning structure and the second positioning structure may be sensor positioning structures, and the user may be reminded by a voice or text from a control system of whether the movable support 4 moves in position. The first positioning structure may be entirely disposed on the movable support 4 or the fixed structure 1, or the first positioning structure may be partly disposed on the movable support 4 and partly disposed on the fixed structure 1. The second positioning structure may be entirely disposed on the movable support 4 or the fixed structure 1, or the second positioning structure may be partly disposed on the movable support 4 and partly disposed on the fixed structure 1.

Figure 25:
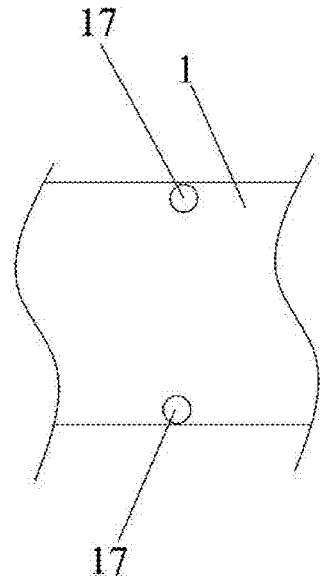
FIG. 25 is a structural view of a fixed structure according to an embodiment of the present disclosure, where the fixed structure is provided with first positioning protrusions.
Figure 26:
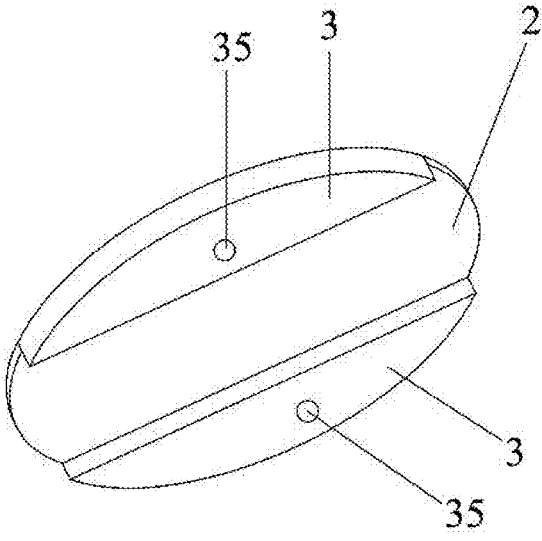
FIG. 26 is a structural view of a first display screen and an external display screen according to an embodiment of the present disclosure, where the external display screen is provided with second positioning protrusions.
Figure 27:
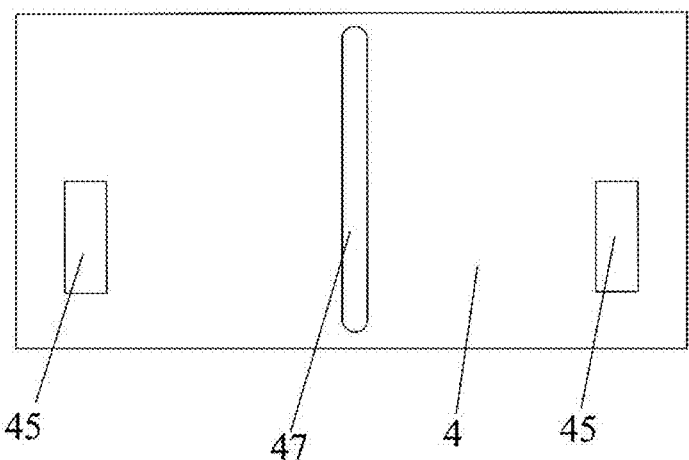
FIG. 27 is a top view of a movable support according to an embodiment of the present disclosure, where the movable support is provided with sliders and a first positioning groove.
Figure 28:
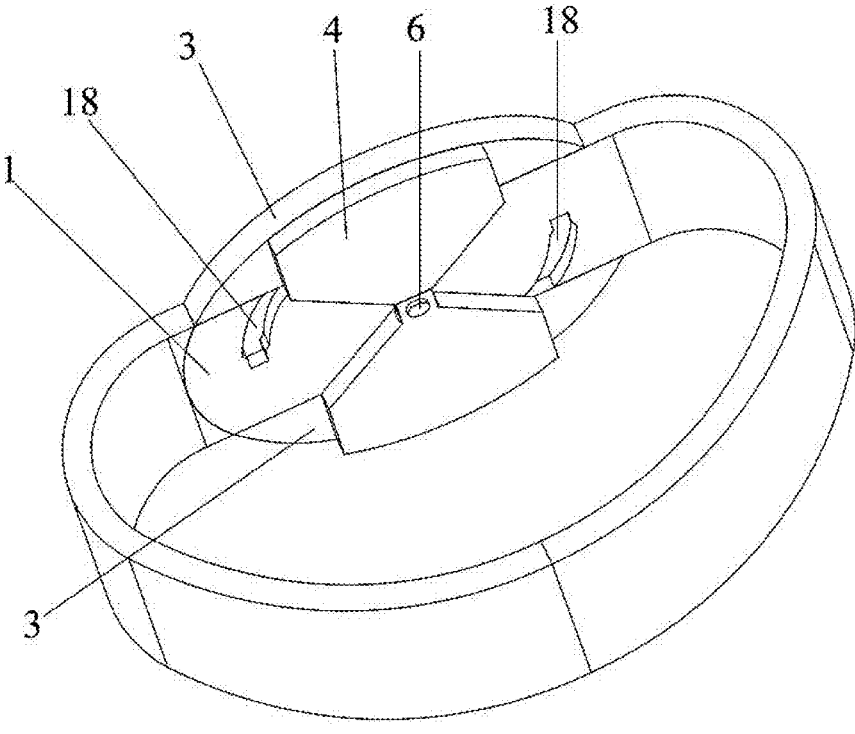
FIG. 28 is a structural view of a display device according to an embodiment of the present disclosure, where a fixed structure is provided with second positioning grooves.

In some embodiments, as shown in FIGS. 25 to 27, the movable support 4 is provided with a first positioning groove 47, and the fixed structure 1 is provided with a first positioning protrusion 17; where in the first state, the first positioning protrusion 17 may be snapped into the first positioning groove 47, and the first positioning protrusion 17 and the first positioning groove 47 form the first positioning structure; and the external display screen 3 is provided with a second positioning protrusion 35, where in the second state, the second positioning protrusion 35 can be snapped into the first positioning groove 47, and the second positioning protrusion 35 and the first positioning groove 47 form the second positioning structure. The first positioning structure and the second positioning structure share the same first positioning groove 47, which can reduce the manufacturing cost and properly use a limited installation space.

In some embodiments, as shown in FIGS. 28 to 31, the movable support 4 is provided with a third positioning protrusion 48, and the fixed structure 1 is provided with second positioning groove 18, where in the first state, the third positioning protrusion 48 may be snapped into the second positioning groove 18, and the third positioning protrusion 48 and the second positioning groove 18 form the first positioning structure; and the external display screen 3 is provided with a third positioning groove 36, where in the second state, the third positioning protrusion 48 may be snapped into the third positioning groove 36, and the third positioning protrusion 48 and the third positioning groove 36 form the second positioning structure. The first positioning structure and the second positioning structure share the same third positioning protrusion 48, which can reduce the manufacturing cost and properly use the limited installation space.

Figure 29:
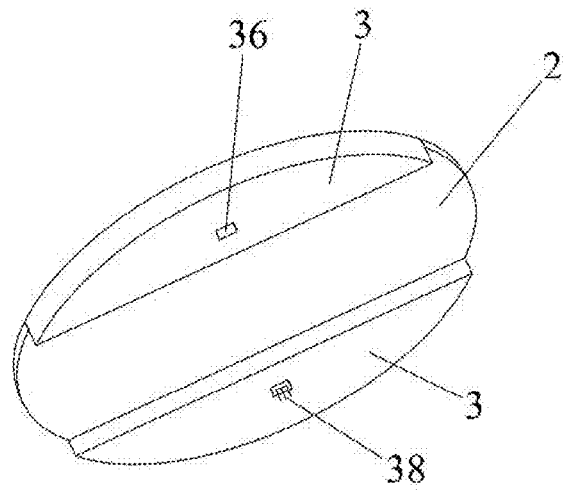
FIG. 29 is a structural view of a first display screen and an external display screen according to an embodiment of the present disclosure, where the external display screen is provided with third positioning grooves and a second connector.
Figure 30:
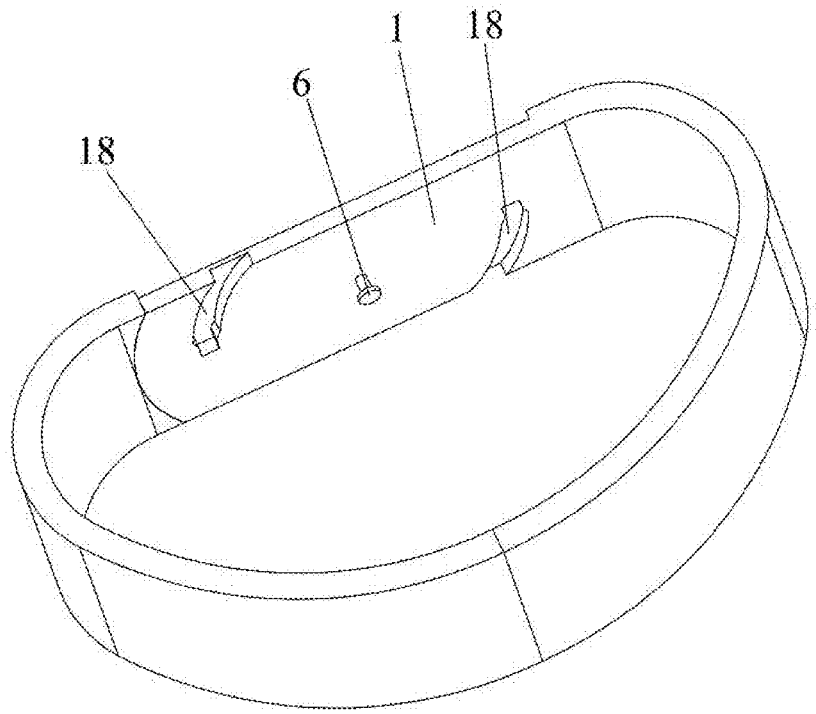
FIG. 30 is a structural view of a fixed structure according to an embodiment of the present disclosure, where the fixed structure is provided with second positioning grooves.
Figure 31:
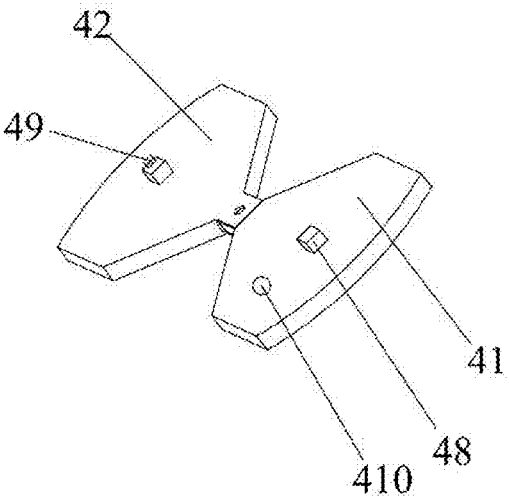
FIG. 31 is a structural view of a movable support according to an embodiment of the present disclosure, where the movable support is provided with third positioning protrusions and a first connector.

As shown in FIGS. 29 and 31, in an embodiment, the movable support 4 is provided with a first connector 49, and the external display screen 3 is provided with a second connector 38, where in the second state, the second connector 38 may be electrically connected to the first connector 49. When the movable support 4 moves relative to the fixed structure 1 until the display device is in the second state, the first connector 49 can be just exposed and is convenient for an electrical connection with the second connector 38 of the external display screen 3. When the movable support 4 moves relative to the fixed structure 1 until the display device is in the first state, the first connector 49 is hidden under the fixed structure 1, preventing impurities from falling into the first connector 49.

Since the movement of the movable support 4 relative to the fixed structure 1 may affect signal transmission of a sensor of the display device, in an embodiment, the movable support 4 is provided with a sensor avoidance opening 410. The sensor of the display device may be a heart rate sensor or a step counting sensor, which is not limited here.

After the external display screen 3 is spliced with the first display screen 2 in structure, display images need to be spliced or displayed independently. In an embodiment, the display device also includes a control mainboard disposed on the fixed structure 1, where the first display screen 2 and the external display screen 3 are connected to the control mainboard, and the control mainboard is configured to receive and process a signal to be displayed and transmit the signal to be displayed to the first display screen 2 and the external display screen 3.

The movable support 4 may move automatically relative to the fixed structure 1 through a driver. The driver may use a servo motor. The servo motor is able to control a speed, has very high position accuracy, and is able to convert voltage signals into torque and rotational speeds to drive a controlled object. Since the servo motor has a relatively high rotational speed, the servo motor may be connected to the movable support 4 through a reduction gearbox, thereby ensuring the smooth operation of the movable support 4, high transmission accuracy, high transmission efficiency, and an accurate gear ratio. Of course, the servo motor may be connected to the movable support 4 through a rack and pinion transmission structure, which is simple in structure, occupies a small space, ensures accurate and reliable transmission, and avoids accumulation of transmission errors. The specific situation needs to be determined according to a corresponding application scenario.

As an example rather than a limitation, when the preceding display device is the wearable device, the wearable device may be a general term for wearable devices developed through an intelligent design of daily wear by using wearable technology, such as gloves and watches equipped with near-field communication modules. The wearable device is a portable device that is worn directly on the body or integrated into the clothing or accessory of the user and that is attached to the user to perform operations such as payment and authentication through a pre-bound electronic card. The wearable device is more than a hardware device and can implement powerful functionality through software support, data interaction, and cloud interaction. The smart wearable device in a general sense includes full-featured and large-sized devices that can implement complete or partial functions without relying on smartphones, such as a smart watch or smart glasses, and devices that only focus on a certain type of application function and need to be used in combination with another device such as a smartphone, such as various types of smart watches or smart bracelets with display screens.

In terms of hardware, the wearable device has a central processor, a memory, an input component, and an output component, that is to say, the wearable device is often a microcomputer device with communication functions. Additionally, the wearable device may have multiple input manners, such as a keyboard, a mouse, a touch screen, a microphone, and a camera, and the input may be adjusted as needed. Meanwhile, the wearable device often has multiple output manners, such as a telephone receiver and a display screen, which may also be adjusted as needed.

In terms of software, the wearable device must have an operating system, such as Windows Mobile, Symbian, Palm, Android, and iOS. Moreover, these operating systems are increasingly open, and personalized application software developed based on the open operating system platforms is emerging, such as an address book, a schedule, a notebook, a calculator, and various games, which greatly satisfy the personalized needs of users.

In terms of communication capability, the wearable device has flexible access manners and high-bandwidth communication performance, and the selected communication manner can be automatically adjusted according to a selected service and an environment, which facilitates use by the user. The wearable device can support Global System for Mobile Communications (GSM), Wideband Code Division Multiple Access (WCDMA), Code Division Multiple Access 2000 (CDMA2000), Time Division-Synchronous Code Division Multiple Access (TDSCDMA), wireless fidelity (Wi-Fi), and World Interoperability for Microwave Access (WiMAX) and thus adapts to various types of networks. The wearable device supports not only voice services but also various wireless data services.

In terms of functional use, the wearable device pays more attention to humanization, individualization, and multi-function. With the advancement of computer technology, the wearable device has shifted from a "device-centric" model to a "user-centric" model and has been integrated with embedded computing, control technology, artificial intelligence technology, and biometric authentication technology, fully embodying a user-centric philosophy. Due to the development of software technology, the wearable device may be customized based on individual requirements and become more individualized. Moreover, the wearable device is integrated with numerous software and hardware and has increasingly powerful functionality.

It is to be noted that the preceding are only preferred embodiments of the present disclosure and technical principles used therein. It is to be understood by those skilled in the art that the present disclosure is not limited to the particular embodiments described herein. Those skilled in the art can make various apparent modifications, adaptations, and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display device, comprising:
a fixed structure;
a first display screen disposed on the fixed structure;
an external display screen; and
a movable support movably disposed on the fixed structure;
wherein the display device has at least a first state and a second state; in the first state, an orthographic projection of the movable support on a plane where the first display screen is located is within a range of the first display screen; in the second state, the orthographic projection of the movable support on the plane where the first display screen is located is at least partially outside the range of the first display screen so that the movable support supports the external display screen configured to be spliced with the first display screen.

2. The display device according to claim 1, wherein the movable support comprises a first support plate and a second support plate, and the external display screen comprises a first external screen and a second external screen, wherein the first support plate and the second support plate are movably disposed on the fixed structure separately, the first support plate is movable to a first support position to support the first external screen, the second support plate is movable to a second support position to support the second external screen, and the first display screen, the first external screen, and the second external screen are capable of being spliced into a first spliced screen.

3. The display device according to claim 2, wherein the first support plate and the second support plate are rotatably disposed on the fixed structure separately, the first support plate is provided with a first avoidance surface, the second support plate is provided with a second avoidance surface, and an avoidance gap is formed between the first avoidance surface and the second avoidance surface, wherein in the first state, an included angle between the first avoidance surface and the second avoidance surface is greater than or equal to 90°.

4. The display device according to claim 1, wherein the movable support comprises a first support plate, wherein the first support plate is movably disposed on the fixed structure, the first support plate is movable to a third support position to support the external display screen, and the first display screen and the external display screen are capable of being spliced into a second spliced screen.

5. The display device according to claim 4, wherein the fixed structure comprises a body part, a first flexible part, and a second flexible part, wherein an end of the first flexible part and an end of the second flexible part are each connected to the body part, another end of the first flexible part and another end of the second flexible part are detachably connected, the first flexible part is provided with a first flexible screen, the second flexible part is provided with a second flexible screen, and the first display screen, the first flexible screen, the second flexible screen, and the external display screen are capable of being spliced into a third spliced screen.

6. The display device according to claim 4, wherein the external display screen is a foldable screen.

7. The display device according to claim 6, wherein at least one of a front-facing camera or a rear-facing camera is disposed on the foldable screen.

8. The display device according to claim 6, wherein the foldable screen comprises a first screen and a second screen arranged at an angle, wherein the first screen and the first display screen are disposed in a same plane.

9. The display device according to claim 8, wherein an included angle between a folding seam between the first screen and the second screen and a side of the first display screen ranges from 0° to 90°.

10. The display device according to claim 1, wherein when the movable support moves relative to the fixed structure, a region of the orthographic projection of the movable support on the plane where the first display screen is located outside the range of the first display screen is a support region, and the support region is adjustable in area.

11. The display device according to claim 10, wherein the movable support is movably disposed on the fixed structure, wherein in the first state, the movable support has a first distance from an edge of the first display screen, and in the second state, the movable support has a second distance from the edge of the first display screen, wherein the first distance and the second distance are different; or the movable support is rotatably disposed on the fixed structure, wherein in the first state, the movable support has a first included angle with an edge of the first display screen, and in the second state, the movable support has a second included angle with the edge of the first display screen, wherein the first included angle and the second included angle are different.

12. The display device according to claim 1, wherein one of the movable support and the fixed structure is provided with a damping groove, and another of the movable support and the fixed structure is provided with a damping protrusion that mates with the damping groove.

13. The display device according to claim 12, wherein at least one damping protrusion is provided, a plurality of damping grooves are provided, and the damping protrusion is capable of mating with any one of the plurality of damping grooves; or at least one damping groove is provided, a plurality of damping protrusions are provided, and the damping groove is capable of mating with any one of the plurality of damping protrusions.

14. The display device according to claim 1, wherein in the first state, the movable support is connected to the fixed structure through a first positioning structure, and in the second state, the movable support is connected to the external display screen through a second positioning structure.

15. The display device according to claim 14, wherein the movable support is provided with a first positioning groove, and the fixed structure is provided with a first positioning protrusion, wherein in the first state, the first positioning protrusion is capable of being snapped into the first positioning groove, and the first positioning protrusion and the first positioning groove form the first positioning structure; and the external display screen is provided with a second positioning protrusion, wherein in the second state, the second positioning protrusion is capable of being snapped into the first positioning groove, and the second positioning protrusion and the first positioning groove form the second positioning structure; or the movable support is provided with a third positioning protrusion, and the fixed structure is provided with second positioning groove, wherein in the first state, the third positioning protrusion is capable of being snapped into the second positioning groove, and the third positioning protrusion and the second positioning groove form the first positioning structure; and the external display screen is provided with a third positioning groove, wherein in the second state, the third positioning protrusion is capable of being snapped into the third positioning groove, and the third positioning protrusion and the third positioning groove form the second positioning structure.

16. The display device according to claim 1, wherein in a case where the orthographic projection of the movable support on the plane where the first display screen is located is within the range of the first display screen, the movable support is locked to the fixed structure through a first locking structure, and in a case where the orthographic projection of the movable support on the plane where the first display screen is located is at least partially outside the range of the first display screen, the movable support is locked to the external display screen through a second locking structure.

17. The display device according to claim 16, wherein the first locking structure and the second locking structure are magnetic components.

18. The display device according to claim 1, wherein the movable support is provided with a sensor avoidance opening.

19. The display device according to claim 1, further comprising a control mainboard disposed on the fixed structure, wherein the first display screen and the external display screen are connected to the control mainboard, and the control mainboard is configured to receive and process a signal to be displayed and transmit the signal to be displayed to the first display screen and the external display screen.

20. The display device according to claim 19, wherein the movable support is provided with a first connector, and the external display screen is provided with a second connector, wherein in the second state, the second connector is capable of being electrically connected to the first connector.

* * * * *